United States Patent [19]

O'Connor et al.

[11] Patent Number: 5,691,742

[45] Date of Patent: Nov. 25, 1997

[54] SOFTWARE BATTERY GAUGE FOR PORTABLE COMPUTERS

[75] Inventors: Clint H. O'Connor, Austin; John J. Pearce, Del Valle, both of Tex.

[73] Assignee: Dell U.S.A., L.P., Austin, Tex.

[21] Appl. No.: 449,160

[22] Filed: May 24, 1995

[51] Int. Cl.⁶ .................. H02J 7/04; G01R 31/36
[52] U.S. Cl. .................. 345/116; 395/750; 395/970; 320/43; 320/48; 324/427; 324/432; 324/433
[58] Field of Search .................. 345/113, 117, 345/116; 324/427, 432, 433; 320/43, 48; 364/710.11; 395/155, 156, 157, 159, 750

[56] References Cited

U.S. PATENT DOCUMENTS

| | | | |
|---|---|---|---|
| 5,341,084 | 8/1994 | Gotoh et al. | 320/48 X |
| 5,341,503 | 8/1994 | Gladstein et al. | 395/750 |
| 5,349,282 | 9/1994 | McClure | 320/48 X |
| 5,349,668 | 9/1994 | Gladstein et al. | 395/750 |
| 5,381,096 | 1/1995 | Hirzel | 324/427 |
| 5,406,188 | 4/1995 | Myslinski et al. | 320/48 X |
| 5,424,722 | 6/1995 | Inada et al. | 324/433 X |
| 5,436,637 | 7/1995 | Gayraud et al. | 345/116 |
| 5,454,710 | 10/1995 | Landau et al. | 324/427 X |
| 5,455,499 | 10/1995 | Uskali et al. | 320/43 |
| 5,477,129 | 12/1995 | Myslinski | 320/48 |
| 5,483,165 | 1/1996 | Cameron et al. | 324/427 |
| 5,508,600 | 4/1996 | Myslinski et al. | 320/48 |
| 5,553,294 | 9/1996 | Nanno et al. | 395/750 |
| 5,565,759 | 10/1996 | Dunstan | 320/48 |

*Primary Examiner*—Raymond J. Bayerl
*Assistant Examiner*—Seth D. Vail
*Attorney, Agent, or Firm*—Haynes and Boone, L.L.P.

[57] ABSTRACT

Method and apparatus for transparently executing in a graphical operating system environment a battery gauge utility that provides accurate battery status information adaptable to different users' needs. In a preferred embodiment, a software battery gauge of the present invention utilizes the primary display of a PC on which it is executing to present information on the exact current charge status of each of one or more batteries of the PC without relying on the presence of a Microsoft/Intel Advanced Power Management driver and compatible BIOS and without continually impinging on the APM or XBIOS interfaces to derive such status information. The battery gauge interfaces with a user through a user interface comprising an animated graphical status indicator and a textual status indicator, which display battery status information continuously such that changes therein can be immediately and conveniently perceived by a user. In addition, the battery gauge comprises a conventional windows system menu, which can be accessed by using the mouse or pointing device, for controlling the appearance of the user interface.

21 Claims, 3 Drawing Sheets

5,691,742

SOFTWARE BATTERY GAUGE FOR PORTABLE COMPUTERS

TECHNICAL FIELD

The invention relates generally to a battery gauge for personal computers (PCs) and, more particularly, to a method and apparatus for performing battery monitoring and user notification functions from a graphical operating system (OS) environment

BACKGROUND OF THE INVENTION

It is generally accepted that the some of the more reliable ways of obtaining comprehensive battery status information in a personal computer (PC) are to execute a proprietary interface or to use the Microsoft™/Intel™ Advanced Power Management (APM) interface. The APM interface provides information concerning whether a battery is present and, if so, the status and charge state of the battery. The user can access this information through a BIOS hot-key function, by running a DOS utility that reports in text format the amount of charge remaining in the battery, or through a Windows utility, such as Microsoft's Power utility, which extracts the information using the APM interface.

A problem with the software battery gauges that are currently available is that they do not provide sufficient information to users about the complete status of the battery or batteries in the PC. In addition, they do not inform users of the time required to fully charge the battery or batteries, which information would be very useful to highly mobile users who need to disconnect their computer as soon as the batteries are charged. Furthermore, the APM interface cannot report the status of each individual battery in a system with more than one battery.

Therefore, what is needed is a software battery gauge that is capable of providing more accurate battery status information, adapting to different user's needs, reporting the status of each battery in a system with multiple batteries, and providing a "time to full charge" feature, and of continuously providing such status information in an efficient manner.

SUMMARY OF THE INVENTION

The foregoing problems are solved and a technical advance is achieved by method and apparatus for transparently executing a battery gauge utility in a graphical OS environment, such as Windows, OS/2, or X-Windows, that provides accurate battery status information adaptable to different users needs. In a departure from the art, the software battery gauge of the present invention utilizes the primary display of a PC on which it is executing to present information on the exact current charge status of each of one or more batteries of the PC without relying on the presence of a Microsoft/Intel Advanced Power Management driver and compatible BIOS and without continually impinging on the APM or BIOS interfaces to derive such status information.

In a preferred embodiment, the battery gauge utility of the present invention is initiated automatically on power up of the PC. The battery gauge interfaces with a user through a user interface comprising an animated graphical status indicator and a textual status indicator. In addition, the battery gauge comprises a conventional user interface system menu which can be accessed by using the mouse or pointing device. In accordance with a feature of the present invention, the animated graphical status indicator displays battery status information such that changes therein can be immediately perceived without the user's having to read the textual status indicator associated with the graphical status indicator. The graphical status indicator shows the amount of charge left in the battery and whether the battery is charging, and can be duplicated to represent multiple batteries. The textual status indicator associated with the graphical status indicator displays battery status information in more exact terms, for example, "68%" or "Charging." Also associated with each graphical status indicator/textual status indicator pair is a menu, which in the preferred embodiment is a conventional pull-down menu, having several menu picks for enabling the user to define various features of the graphical and textual status indicators of the battery gauge.

In one aspect of the present invention, the program updates the user interface (i.e., the graphical and textual status indicators) by periodically polling an extended BIOS (XBIOS) interface to see if there have been any changes in the battery status. If the battery status has remained unchanged from the previous polling, the battery gauge will not burden the APM interface or XBIOS interface for further data. If the battery status has changed from the previous polling, the battery gauge will obtain more accurate battery status information through the APM interface. The battery gauge is also capable of obtaining additional battery status information through the XBIOS interface.

A technical advantage achieved with the invention is that it provides a software driven battery gauge which utilizes the primary display of a PC. This battery gauge utilizes unique graphical and textual status indicators for accurately representing the current status of the battery, as well as a pull-down system menu for setting user preferences and other customizations.

A second technical advantage achieved with the invention is that it provides a battery gauge that does not rely upon the presence of an APM interface and compatible BIOS. In the absence of information from an APM interface, the battery gauge switches to an internal XBIOS to extract the necessary battery status information.

A third technical advantage achieved with the invention is that it provides a battery gauge that does not continually impinge on the APM or XBIOS interfaces to derive battery status information, which in some PCs can yield undesirable performance hits to extract the information. Instead, the battery gauge depends upon a "changed state" call to the XBIOS to determine whether it is necessary to get the full information, thereby minimizing performance hits.

A fourth technical advantage achieved with the invention is that it provides a battery gauge that can report information on multiple batteries in the PC through the XBIOS interface.

A fifth technical advantage achieved with the invention is that it provides a battery gauge that computes and displays a time to full charge. The battery gauge obtains specific information on total battery capacity through the XBIOS interface and derives a time to full charge based on known charger supply current for quick-charge and fickle charging.

DETAILED DESCRIPTION OF THE PREFERRED EMBODIMENT

Figure 1:
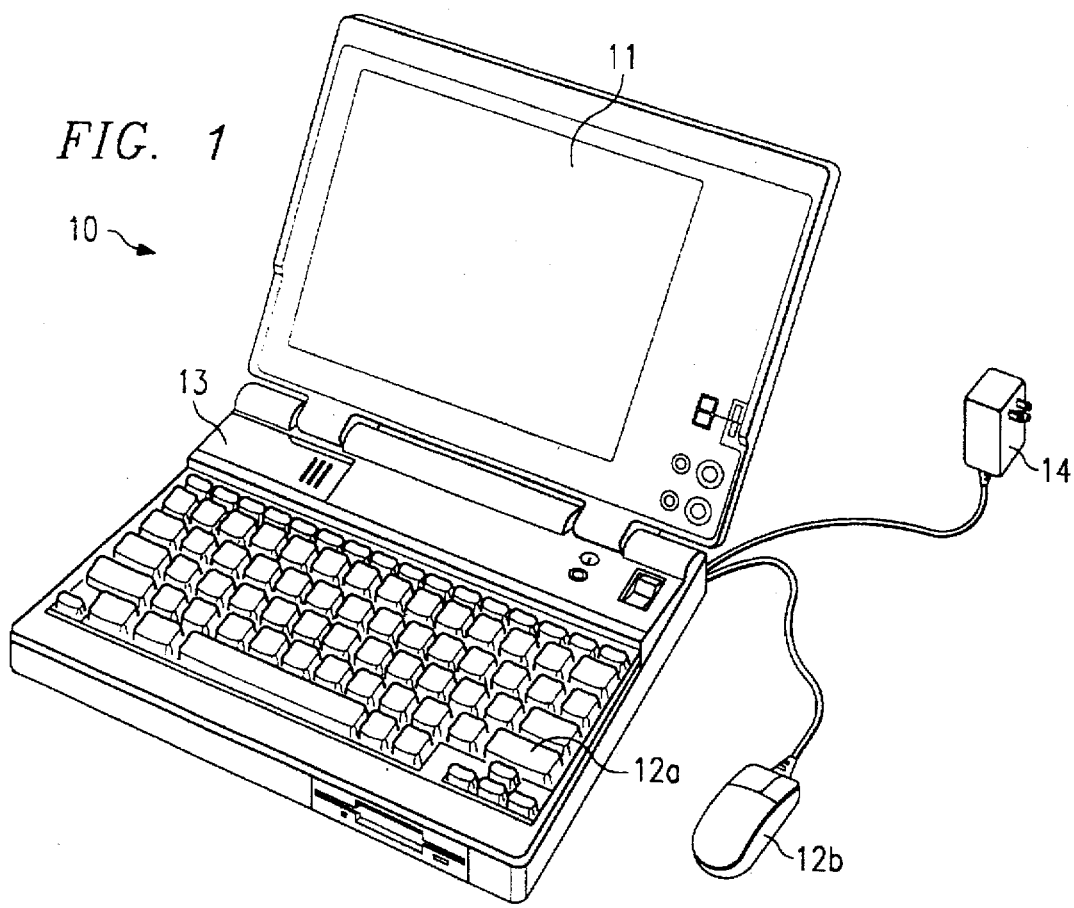
FIG. 1 is a diagram of a portable personal computer (PC) in which the battery gauge of the present invention may be implemented.

FIG. 1 is an external diagram of a portable PC 10 in which a software battery gauge embodying features of the present invention may be implemented. In a preferred embodiment, the PC 10 comprises a display 11 and input devices 12a and 12b, respectively comprising a keyboard (12a) and a mouse-type pointing device (12b), it being understood that many different input devices would serve the equivalent function of the mouse-type pointing device 12b. The PC 10 is capable of running a graphical OS. The input devices 12a and 12b enable a user to selectively interface with the PC 10 in accordance with information shown on the display 11. The PC 10 is further connectable to a battery 13 and an external power supply 14 for providing power to the PC 10.

Figure 2:
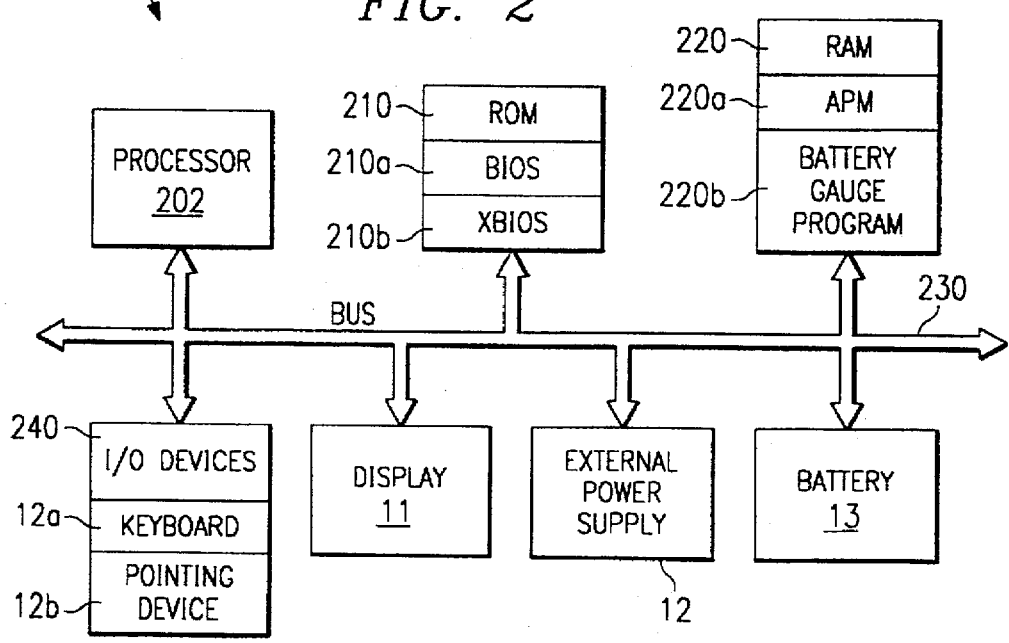
FIG. 2 is a system block diagram of the PC of FIG. 1 embodying features of the present invention.

FIG. 2 is a system block diagram of the PC 10 of FIG. 1 in which a software battery gauge for a PC is implemented. In a preferred embodiment, the PC 10 comprises a processor 202 connected to system ROM 210 and RAM 220 via a host bus 230. The processor 202 is further connected to the display 11, external power supply 12, battery 13, and a plurality of other I/O devices collectively designated by a reference numeral 240. I/O devices 240 may include, for example, the keyboard 12a (FIG. 1), a disk drive and the pointing device 12b (FIG. 1). A utility program providing standard battery status information, such as the Microsoft/Intel APM program, and a program for implementing the battery gauge of the present invention, respectively designated by a reference numerals 220a and 220b, are stored in system RAM 220. Additionally, standard BIOS code and customized XBIOS code, respectively designated by reference numerals 210a and 210b, are stored in ROM memory 210, which, in a preferred environment, comprises a flash memory device, an electrically erasable programmable read-only memory (EEPROM) or some other appropriate ROM device.

Figure 4:
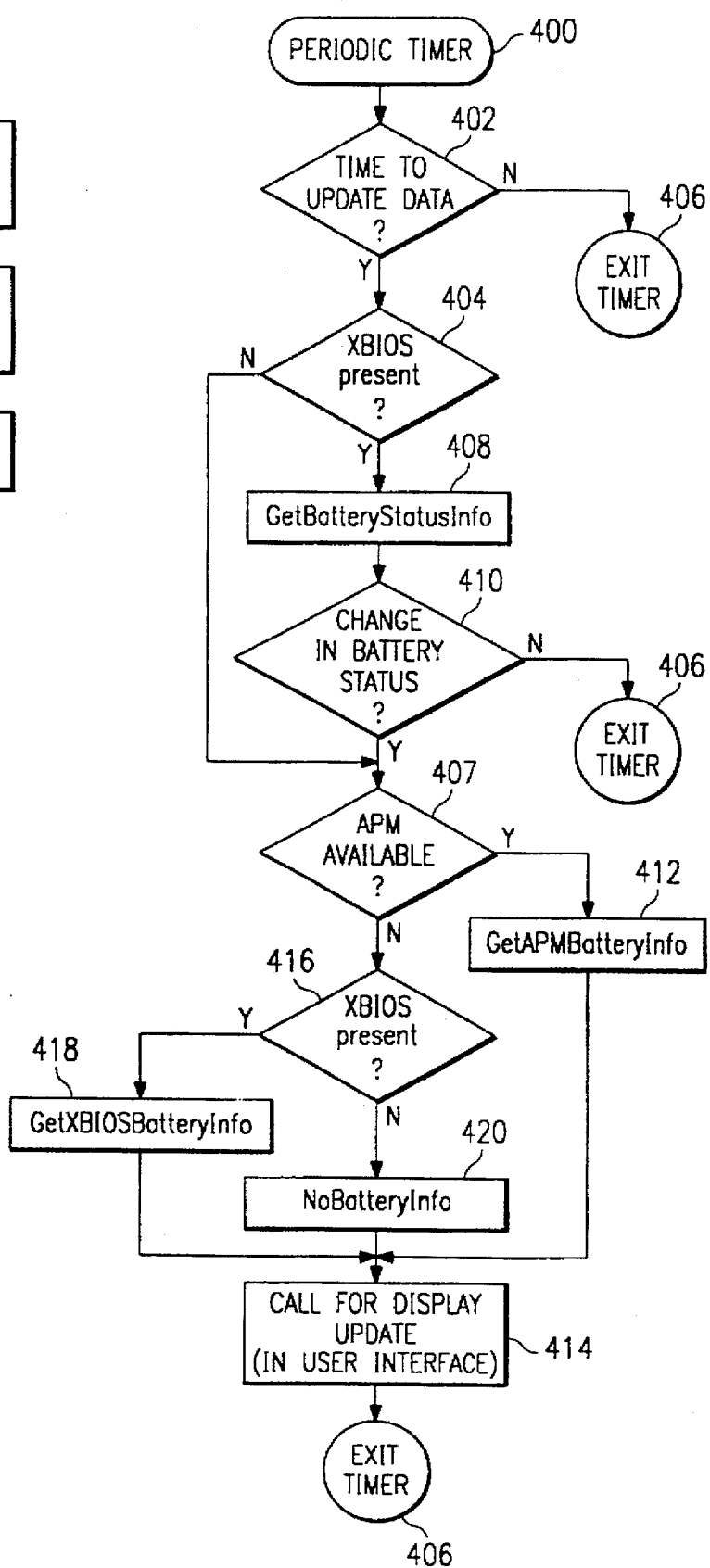
FIG. 4 is a flowchart of a periodic timer subroutine of a program implementing the battery gauge of the present invention.
Figure 5:
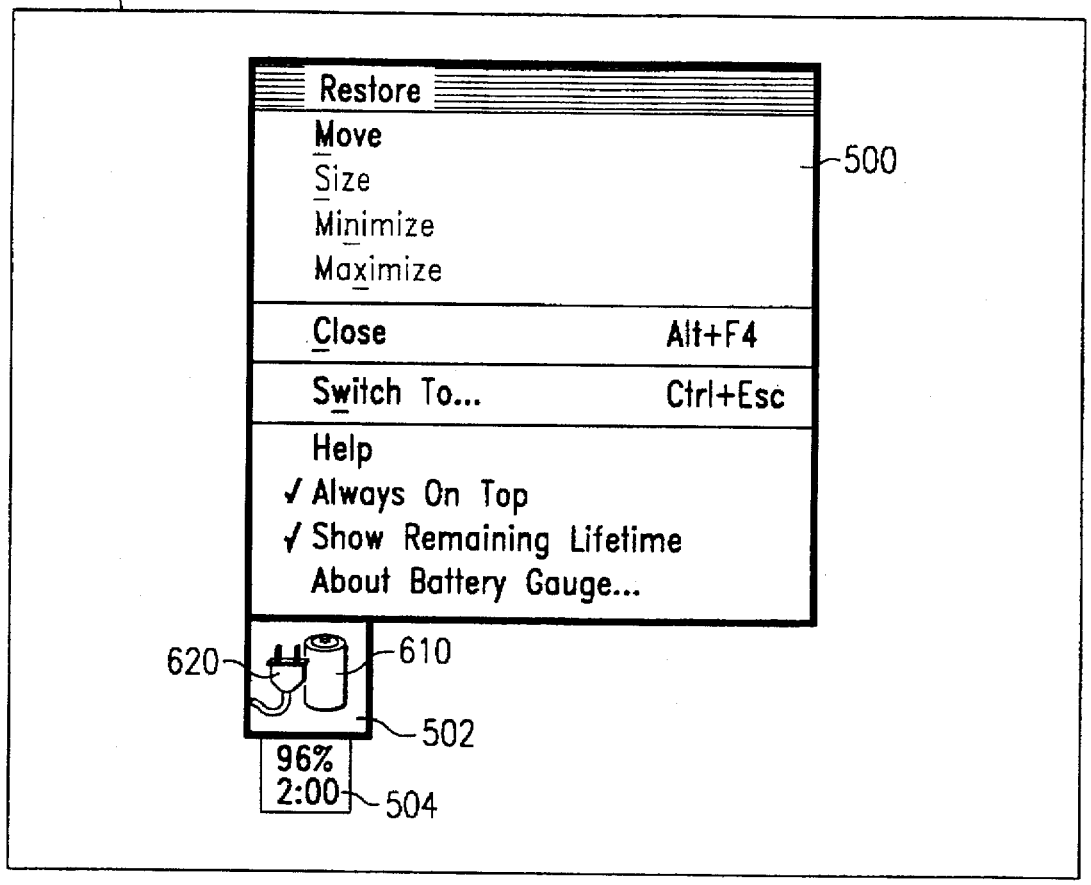
FIG. 5 illustrates a system menu and user interface of a program for implementing the present invention, as displayed on the PC display.

In particular, the Microsoft/Intel APM program 220a, which is a presently available utility for measuring the current state of the battery, may be stored in the RAM 220 along with a battery gauge utility program 220b embodying features of the present invention, which will be described in detail below with reference to FIGS. 3–6. The program 220b comprises a main subroutine (FIG. 3), a periodic timer subroutine (FIG. 4), a user interface (FIGS. 5 and 6), and a system menu comprising a portion of the user interface (FIG. 5). The BIOS code 210a includes conventional boot code as well as code for measuring the charge left in the battery 13. The XBIOS code 210b includes additional code to further monitor the battery 13, as well as any additional batteries (not shown) used to power the PC 10, and calculate the time needed to fully charge each battery.

Figure 3:
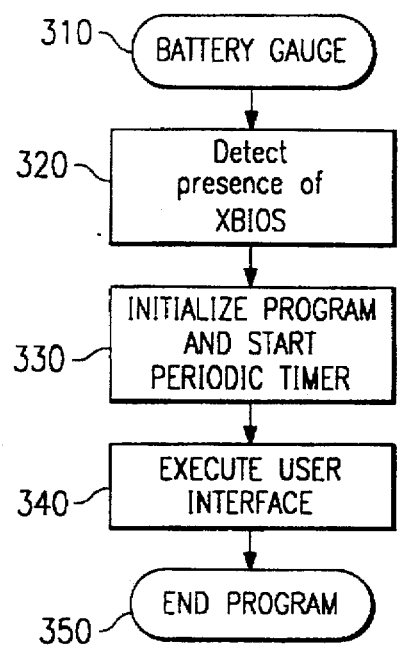
FIG. 3 is a flowchart of a main subroutine of a program for implementing the battery gauge of the present invention.

FIG. 3 illustrates a flowchart of the main subroutine of the battery gauge program 220b. Execution automatically begins in step 310 upon initiation of the graphical OS of the PC 10. In step 320, a determination is made whether an XBIOS, such as XBIOS 210b, is present and an internal flag (not shown), the use of which will be described in detail below with reference to FIG. 4, is set accordingly. In step 330, the settings and periodic timer subroutines are initialized and the periodic timer subroutine is initiated. The settings subroutine is described in detail with reference to FIG. 5. In step 340, the user interface, which is described in detail with reference to FIGS. 6a–6b, is displayed.

FIG. 4 illustrates a flowchart of the periodic timer subroutine of the battery gauge program 220b. The flowchart of FIG. 4 depicts the function of the periodic timer routine with the details of battery communications encapsulated in the functions; for example, a "GetXBIOSBatteryInfo" function is used to extract battery status information through the XBIOS interface and store it in a known memory location (not shown) for purposes to be described. It should be understood that functions such as the GetXBIOSBatteryInfo function represent calls to the customized XBIOS. The exact format of these internal references are dictated by the PC's BIOS, XBIOS, and other system management interfaces, and because implementation of such functions is understood by those skilled in the art, it is not discussed further herein.

Execution of the periodic timer subroutine of the program of the present invention begins in step 400. In step 402, a determination is made whether it is time to update the battery status information data. The battery gauge program only checks the battery status on user or program-determined intervals. If in step 402, the time interval has expired, execution proceeds to step 404. If in step 402 the time interval has not expired, execution proceeds to step 406, where it exits back to step 330 of the main subroutine (FIG. 3).

In step 404, the timer subroutine determines whether an XBIOS is present by checking the internal flag previously set in step 320 (FIG. 3). If the XBIOS is not present, execution proceeds to step 407. If the XBIOS is present, execution proceeds to step 408, in which a "GetBatteryStatusInfo" function is executed to obtain initial battery status information through the XBIOS interface and store it in a known memory location (not shown). Execution then proceeds to step 410, in which the newly returned battery status is compared with the previous battery status, which has been previously obtained and stored in a known memory location. If there is no change in the battery status, that is, if the new battery status information is identical to the previous battery status information, execution proceeds to step 406, where it exits back to step 330 of the main subroutine (FIG. 3). In this manner, when there is no change in the battery status information, the overhead involved in obtaining full status information via the APM interface can be avoided. If in step 410 there is a change in battery status, execution proceeds to step 407.

In step 407, a determination is made whether an APM driver is available. If so, execution proceeds to step 412, in which a "GetAPMBatteryInfo" function is executed to obtain complete battery status information from the APM driver and store the battery status in a known memory location (not shown). After this data is obtained, execution proceeds to step 414. If in step 407 an APM dryer is not available, execution proceeds to step 416, in which a determination is again made whether an XBIOS is present. If the XBIOS is present, execution proceeds to step 418, in which a "GetXBIOSBatteryInfo" function is executed to obtain complete battery status information via the XBIOS interface. Once this data has been obtained, execution proceeds to step 414. If in step 416 the XBIOS is not present, execution proceeds to step 420, in which a "NoBatteryInfo" function is executed, indicating that no battery status information is available. Execution then proceeds to step 414.

In step 414, a "CallForDisplayUpdate" function is executed. The CallForDisplayUpdate function updates the user interface, specifically, the graphical and textual status indicators, to reflect the current status of the battery. The user interface is described in detail below with reference to FIGS. 5 and 6. Once the user interface has been updated, execution proceeds to step 406, where it exits back to step 330 of the main subroutine (FIG. 3).

FIG. 5 illustrates the system menu of the present invention as it appears on the PC display 11. The system menu can take several forms, depending upon the OS and program implementation. In its current form, the system menu comprises a conventional pull-down menu 500, which is displayed responsive to a user's selection of a graphical status indicator 502 or textual status indicator 504, for example, using the mouse-type pointing device 12b. The graphical status indicator 502 and the textual status indicator 504 are described in detail with reference to FIG. 6. In this standard menu, additional menu items may be added to the menu 500 using predefined Application Programming Interface (API) function calls. These additional items allow the user to call up a Settings dialog to change preferences such as the Always On Top behavior of the settings or can be line items in the menu for direct preference changes without going through a dialog. The operation of a system menu like the one used in the present invention is known by those skilled in the art, and is therefore not described further herein.

The animated graphical status indicator 502 is the primary visible component of the battery gauge. It is implemented using the OS's Application Programming Interface functions. The characteristic of the graphical status indicator 502 is that changes can be perceived immediately without reading the text around it. The graphics state is keyed to a number of internal factors and changes to alert the user to changes in operation and battery condition. These internal states include: (1) normal battery operation (no AC power); (2) battery with AC adapter; (3) AC adapter only (no battery); (4) low and/or critical battery status (with or without an AC adapter); (5) no battery, no AC (this can only occur in computers with a built-in reserve battery); and (6) no APM (shows that advanced power management features are not available).

Figure 6:
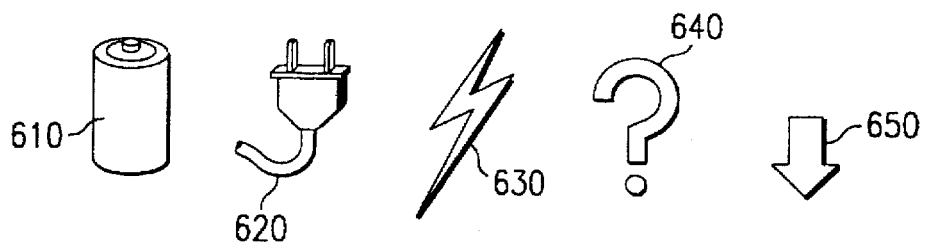
FIG. 6 illustrates a features of a user interface of a program for implementing the present invention, as displayed on the PC display.

Referring to FIG. 6, the internal power supply states listed above are represented in the graphical status indicator 502 displayed on the display 11 as battery symbol 610, AC plug symbol 620, an optional lightning bolt symbol 630, a question mark symbol 640, and/or a down-arrow symbol 650. The battery symbol 610 is used to graphically indicate to the user available battery status information and is outlined (with no detail) when a battery 13 is not present. When a battery 13 is present, the symbol 610 is filled in with a split image, the top part in red depicting the depleted level of the battery and the bottom part in green depicting the remaining charge left in the battery. The AC symbol 620 is used to graphically indicate to the user the status of the external power supply 12. It is filled-in with detail when the external power supply 12 is present and outlined when not. The lightning-bolt symbol 630 is an alternate symbol to represent charging. Normally, the red/green battery fill is displayed even when the battery 13 is charging. However, for a PC 10 that cannot support reading battery information while the battery is charging, a lightning-bolt symbol 630 is displayed over the battery symbol 610 and a halo is displayed around the tips of the AC plug symbol 620 to show the user the battery 13 is being charged and that further battery status information is temporarily unavailable. When the battery 13 reaches a low or critical charge condition, a down-arrow symbol 650 is displayed over the battery symbol 610 to indicate the battery 13 is going down. This down-arrow symbol 650 can be made to flash at a fixed periodic rate or at a rate inversely proportional to the time remaining before the PC 10 will be powered down, with flashing becomes more rapid as battery charge decreases. If the battery gauge software 220b is installed on a PC 10 that does not include an XBIOS interface 210b, the battery gauge software 220b will attempt to use the APM driver 220a. If the APM driver 220a is not present or does not respond, a question mark symbol 640 is displayed to alert the user that the battery gauge program 220b is unable to obtain battery status information and is therefore nonoperational.

In PCs with multiple batteries (not shown), the battery symbol 610 is duplicated in a discrete or overlaid fashion so that at least a portion of the red/green charge indication is visible for each battery. The battery symbol(s) 610 can also be arranged to show or suggest a relationship with the physical location of the batteries in the PC 10.

As previously indicated, the textual status indicator 504 forms the second visible component of the battery gauge. It supplies information in a more precise manner than the graphical status indicator 502. For example, it shows the exact percentage remaining, e.g. "99%.". It also indicates "Charging" when the charger is plugged in. Although not shown, it should be understood that the textual status indicator 504 may also display an estimated time to charge the battery 13, based upon battery status information and charger supply current under quick-charge and trickle conditions. Furthermore, several textual status indicators 504, each corresponding to one of multiple batteries (not shown) of the PC 10 may be displayed on one or more lines. The battery status information shown is dependent upon the user's preferences which are selected using the menu 500 (FIG. 5). The location of the textual status indicator 504 in relation to the graphical status indicator 502, for example, below, above or superimposed thereon, may also be selected using the menu 500.

Available information for the textual status indicator 504 may vary, depending upon whether the XBIOS 210b is present and whether the APM driver 220a supports revision 1.0, which cannot indicate that the battery is both charging and low or critical, or revision 1.1, which reports these conditions as individual flags and can report a BIOS-estimated battery lifetime.

It is understood that the present invention can take many forms and embodiments. The embodiments shown herein are intended to illustrate rather than to limit the invention, it being appreciated that variations may be made without departing from the spirit or the scope of the invention.

Although illustrative embodiments of the invention have been shown and described, a wide range of modification, change and substitution is intended in the foregoing disclosure and in some instances some features of the present invention may be employed without a corresponding use of the other features. Accordingly, it is appropriate that the appended claims be construed broadly and in a manner consistent with the scope of the invention.

What is claimed is:

1. In a computer comprising a display and a processor and connectable to at least one battery for deriving power therefrom, a method for providing to a user a charge condition of each of said at least one battery comprising, for each of said at least one battery:

displaying on said display a user interface indicating a charge condition of said battery, said user interface comprising a graphical status indicator portion and a textual status indicator portion;

upon each elapse of a preselected time period, eliciting battery status information for said battery;

updating said graphical and textual status indicators displayed on said display using said elicited battery status information prior to said eliciting, determining whether said charge condition of said battery changed during said preselected time period and responsive to a determination that said charge condition of said battery has not changed during said preselected time period, omitting performance of said eliciting and updating.

2. The method of claim 1 further comprising displaying on said display a system menu or dialog box for receiving user preferences, said user preferences defining an appearance of said user interface on said display.

3. The method of claim 1 further comprising, while said battery is being recharged, continuously determining and indicating to said user an amount of time remaining until said battery will be fully charged, said indicating being accomplished via said user interface.

4. The method of claim 1 wherein said user interface indicates to said user an amount of charge remaining on said battery.

5. The method of claim 1 wherein said computer is further connectable to an alternating current (AC) power supply for deriving power therefrom, the method further comprising, when said computer is connected to said AC power supply, indicating to said user, via said user interface, that said computer is deriving power from said AC power supply, rather than from said at least one battery.

6. A method for indicating to a user a charge status of each of at least one battery connected to a computer for providing power thereto, the apparatus comprising, for each of said at least one battery:

displaying on a display of said computer a user interface indicating said charge status of said battery, said user interface comprising a graphical status indicator portion and a textual status indicator portion;

periodically determining whether said charge status of said battery has changed from a previous charge status;

responsive to a determination that said charge status has changed, obtaining comprehensive battery status information for said battery; and updating said user interface using said comprehensive battery status information; and prior to said obtaining:

determining whether said comprehensive battery status information is available; and responsive to a determination that said comprehensive battery status information is not available, indicating to said user via said user interface that no battery status information is available.

7. The method of claim 6 wherein said step of obtaining is performed by executing an extended BIOS (XBIOS) function.

8. The method of claim 6 wherein said step of obtaining is performed using an advanced power management (APM) interface.

9. The method of claim 6 wherein said graphical status indicator comprises an animated battery-shaped icon and wherein a first portion of said battery-shaped icon is filled in with a first color for representing an amount of charge remaining in said battery and a second portion of said battery-shaped icon is filled in with a second color for representing an amount of charge depleted from said battery.

10. The method of claim 6 further comprising, while said battery is being recharged, displaying, via said textual status indicator, an amount of time required to fully charge said battery.

11. The method of claim 6 further comprising, while said battery is being recharged, indicating to said user, via said graphical status indicator, that said battery is being recharged.

12. In a computer comprising a display and a processor and connectable to at least one battery for deriving power therefrom, an apparatus for providing to a user a charge condition of each of said at least one battery comprising:

means for displaying on said display for each of said at least one battery a user interface associated with said battery, said user interface indicating a charge condition of said battery and comprising a graphical status indicator portion and a textual status indicator portion;

means for eliciting battery status information for each of said at least one battery upon each elapse of a preselected time period;

means for updating said graphical and textual status indicators for each of said at least one battery using said elicited battery status information for said battery; and for each of said at least one battery:

means for determining whether said charge condition of said battery changed during said preselected time period prior to said eliciting; and means responsive to a determination that said charge condition of said battery has not changed during said preselected time period for skipping said eliciting and updating.

13. The apparatus of claim 12 further comprising means for displaying on said display, for each of said at least one battery, a system menu or dialog box for receiving user preferences, said user preferences defining an appearance of said associated user interface on said display.

14. The apparatus of claim 12 further comprising, for each of said at least one battery, means for continuously determining and indicating to said user, while said battery is being recharged, an mount of time remaining until said battery will be fully charged during recharging of said battery, said indicating being accomplished via said associated user interface.

15. The apparatus of claim 12 wherein said associated user interface indicates to said user an amount of charge remaining on said battery.

16. The apparatus of claim 12 wherein said computer is further connectable to an alternating current (AC) power supply for deriving power therefrom, the apparatus further comprising means for indicating to a user, via said associated user interface, that said computer is deriving power from said AC power supply, rather than from said at least one battery.

17. A computer program stored on a computer-readable medium and executable in a computer having a display and a processor and connectable to at least one battery for deriving power therefrom, the computer program for providing to a user a charge condition of each of said at least one battery, the computer program comprising:

instructions for displaying on said display a user interface indicating a charge condition of said battery, said user interface comprising a graphical status indicator portion and a textual status indicator portion;

instructions for eliciting battery status information for said battery upon each elapse of a preselected time period;

instructions for updating said graphical and textual status indicators displayed on said display using said elicited battery status information; and instructions for, prior to said eliciting, determining whether said charge condition of said battery changed during said preselected time period and, responsive to a determination that said charge condition of said battery has not changed during said preselected time period, omitting performance of said eliciting and updating.

18. The computer program of claim 17 further comprising instructions for displaying on said display a system menu or dialog box for receiving user preferences for defining an appearance of said user interface on said display.

19. The computer program of claim 17 further comprising instructions for continuously determining and indicating to said user an amount of time remaining until said battery will be fully charged while said battery is being recharged, said indicating being accomplished via said user interface.

20. The computer program of claim 17 wherein said user interface indicates to said user an amount of charge remaining on said battery.

21. The computer program of claim 17 further comprising instructions for indicating to said user, via said user interface, that said computer is deriving power from an AC power supply, rather than from said at least one battery, when said computer is connected to an AC power supply.

* * * * *

UNITED STATES PATENT AND TRADEMARK OFFICE
CERTIFICATE OF CORRECTION

PATENT NO. : 5,691,742
DATED : November 25, 1997
INVENTOR(S) : Clint H. O'Connor et al.

It is certified that error appears in the above-identified patent and that said Letters Patent is hereby corrected as shown below:

Column 2, line 57, "fickle" should be --trickle--.

Column 3, line 27, "a system" should be --an internal system--.

Column 4, line 57, "dryer" should be --driver--.

Column 8, line 41, "mount" should be --amount--.

Signed and Sealed this

Third Day of March, 1998

Attest:

BRUCE LEHMAN

Attesting Officer

Commissioner of Patents and Trademarks